United States Patent [19]

Lee

[11] Patent Number: 4,685,196

[45] Date of Patent: Aug. 11, 1987

[54] METHOD FOR MAKING PLANAR FET HAVING GATE, SOURCE AND DRAIN IN THE SAME PLANE

[75] Inventor: Ming-Kwang Lee, Hsinchu, Taiwan

[73] Assignee: Industrial Technology Research Institute, Hsinchu, Taiwan

[21] Appl. No.: 760,129

[22] Filed: Jul. 29, 1985

[51] Int. Cl.[4] .................. H01L 21/263; H01L 21/306; H01L 7/36

[52] U.S. Cl. .............................. 437/41; 148/DIG. 82; 156/628; 156/643; 357/23.9; 357/23.14; 437/203; 437/20

[58] Field of Search ...................... 29/571, 576 B, 578; 148/1.5, 187, 175; 357/28.9, 23.14; 156/628, 643

[56] References Cited

U.S. PATENT DOCUMENTS

| 3,764,413 | 10/1973 | Kakizaki et al. | 357/23.9 |
| 4,356,211 | 10/1982 | Riseman | 29/576 B |
| 4,441,941 | 4/1984 | Nozawa | 148/187 |
| 4,444,605 | 4/1984 | Slawinski | 148/187 |
| 4,477,310 | 10/1984 | Park et al. | 156/643 |
| 4,494,304 | 1/1985 | Yoshioka | 29/578 |
| 4,554,728 | 11/1985 | Shepard | 29/576 W |
| 4,609,413 | 9/1986 | Boland | 148/175 |

FOREIGN PATENT DOCUMENTS 2526586 5/1982 France .

OTHER PUBLICATIONS

L. D. Yau, "A Simple Theory to Predict the Threshold Voltage...", pp. 1059–1063 of Solid-State Electronics, 1974, vol. 17.

G. Merckel, "Short Channels-Scaled Down MOSFET's", pp. 705–725 of Process and Device Modeling for IC Design, 1977, ed. F. VandeWiele et al.

S. M. Sze, Physics of Semiconductor Devices, 2nd ed., pp. 469–509.

Patent Abstracts of Japan, vol. 6, No. 12 (23 Jan. 1982) of Oki Denki Kogyo K.K. (Kentarou Yoshioka), JP A 56133869.

S. Nishimatsu et al. "Grooved Gate MOSFET" in Japanese J. of Applied Physics, vol. 16, Supp. 16-1 (1977) 179–183.

Primary Examiner—Upendra Roy
Attorney, Agent, or Firm—Bert J. Lewen; Henry Sternberg

[57] ABSTRACT

An MOS transistor with a trench channel and self-aligned source and drain contacts to the interconnection layer. The MOS transistor is fabricated by first etching the substrate of monocrystalline silicon so as to form a trench channel and thereafter filling the trench channel with an anisotropic etched first polycrystalline silicon film. Buried contacts of polycrystalline silicon to the substrate, and Al-Si metallization are used. The trench structure in the channel regions permits the self-alignment of the gate element and the buried contacts to source and drain regions. The MOS transistors of the invention significantly reduce the short channel effect as observed in conventional MOS transistors.

11 Claims, 15 Drawing Figures

METHOD FOR MAKING PLANAR FET HAVING GATE, SOURCE AND DRAIN IN THE SAME PLANE

BACKGROUND OF THE INVENTION

In a conventional MOS transistor having a polycrystalline-silicon gate, both the gate dielectric and electrode layers are stacked directly on the planar surface of the silicon substrate as shown in FIGS. 1A and 1B. The heavily doped source and drain regions therefore must be profiled so that the junction interfaces are posited under the substrate surface. It has been previously reported by L. D. Yau, "A Simple Theory to Predict the Threshold Voltage of Short-Channel IGFET's", page 1059 in Volume 17 of Solid State Electronics in 1974, and by G. Merckel, "Short Channels-Scaled Down MOSFET's", page 705 of "Process and Device Modeling for IC Design" edited by F. Van de Wiele et al. in 1977, that this conventional planar-MOS structure would have small geometry effects if the feature size of channel region were scaled down. See also S. M. Sze, Physics of Semiconductor Devices, pp. 469-509.

Also, to improve process control and to reduce dimension loss due to lateral diffusion, ion implantation is used to heavily dope the source and drain regions to a shallow junction depth. The implanted shallow junction, however, is deficient because of problems with the corner profile.

In addition, conventional processing is deficient where high circuit density is sought because the required alignment tolerance for the contact windows cannot be achieved. Unfortunately, it would be extremely expensive to fabricate a product not having these deficiencies using conventional planar MOS structure.

In order to overcome the problems of conventional MOS transistor fabrication for IC applications, the present invention describes an MOS transistor having a trench in the channel region. The now ancient U.S. Pat. No. 3,805,129 shows the gate of a field effect transistor deposited on the bottom of a trench. However, this reference does not show, among other things, the use of a polysilicon gate, a gate in the same plane as the source and drain regions, or doping to simlutaneously form a gate, source and drain region.

The trench structure can be etched by reactive ion etching as described in U.S. Pat. Nos. 4,139,442; 4,356,211; and 4,477,310. Theoretically, the MOS structure having the trench structure of the invention will have the advantage of less small-geometry effects because there is less overlapping charge between the depleted channel and the depleted source (and/or drain) regions.

Another advantage of the present invention is the ease of self-alignment of the heavily doped source and drain, and the polycrystalline silicon (polysilicon) gate electrode. This self-alignment also provides self-alignment of the contact between the conducting polysilicon lines and the source and drain regions. The self-alignment makes the dimension loss much less with the same feature size when a given photolithographic technique is performed.

The third advantage is that the shortcomings of shallow junction implantation due to the sharp concentration profile on junction corners in the conventional planar MOS structure is overcome. Deeper junction depth in source and drain doping is acceptable, thereby giving a better junction profile on the junction corners.

SUMMARY OF INVENTION

An object of the present invention is to provide a new MOS transistor structure for producing high circuit density products for integrated circuits and a method of fabricating such transistors.

Another object of the invention is a new transistor having improved junction reliability for a high density integrated circuit.

A further object of the present invention is to provide a new transistor having a trench channel MOS structure and a fabrication method for self-alignment for doping of source and drain regions, of conducting gate-electrodes, and of buried contacts of conducting polysilicon lines to source and drain regions. Buried contacts formed by this method have low sheet resistance compared with those formed using conventional methods.

An additional object of the invention is to provide a new transistor with reduced small geometry effects and a method of fabrication in which polysilicon is used to refill the trench of the substrate and thereafter the polysilicon and the source and drain regions are heavily doped simultaneously.

Still another object of the invention is to provide a method of fabriction of a trench channel MOS transistor in which oxidation is performed to remedy the curvature problem and to ensure meeting the specification on field strength of oxide breakdown on the trench corners.

A still further object of the invention is to provide a new transistor and method of fabrication in which the finished surface of the trench channel transistor is planarized. Integrated circuits designed and fabricated using this structure will have a well-planarized surface in the active regions.

A still additional object of the invention is to provide a new transistor and method of fabrication in which the interconnection metal lines are connected with conducting polysilicon on the top of field oxide regions.

DESCRIPTION OF DRAWINGS

FIG. 1B shows the use of an additional buried-contact of polysilicon film to substrate.

FIG. 2M is a cross-section view of a trench channel n-MOS transistor made in accordance with the method of the present invention.

DESCRIPTION OF PREFERRED EMBODIMENT

Figure 1A:
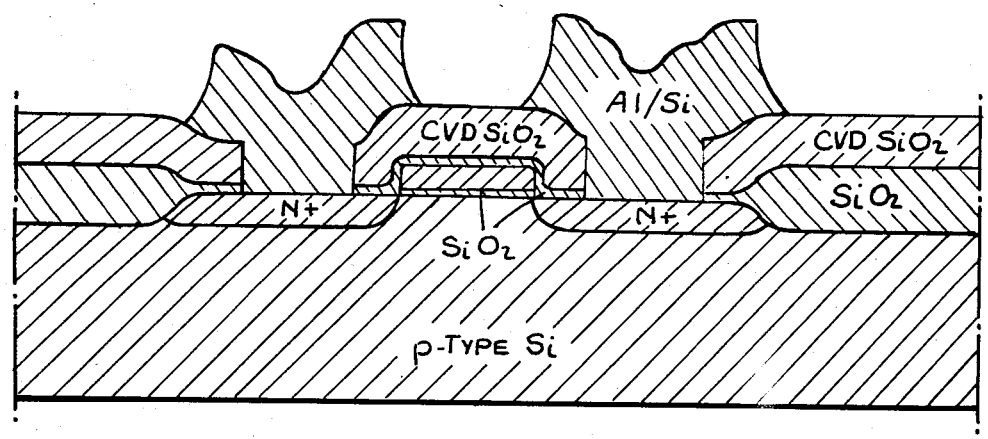
FIGS. 1A and 1B show the cross-section view of a silicon-gated n-MOS transistor fabricated using conventional methods.
Figure 1B:
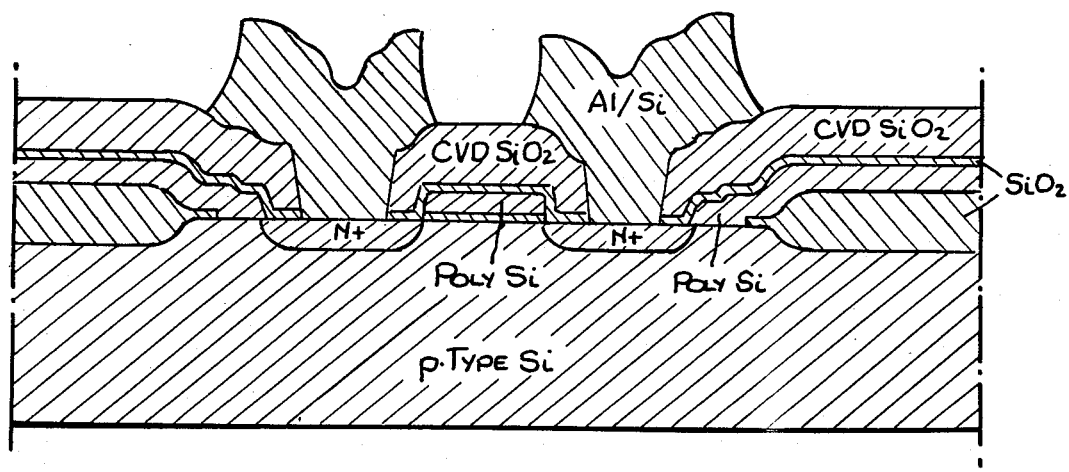
Figure 2A:
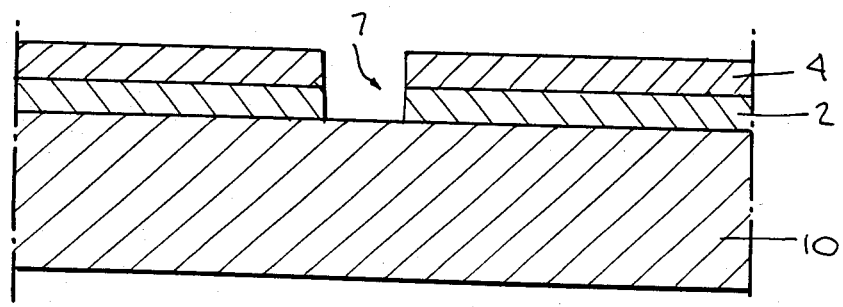
FIGS. 2A and 2M show the successive structures formed in manufacturing the trench channel n-MOS transistor of the present invention. The trench structure is formed in the channel region and the coated trench is filled with unoxidized polycrystalline silicon.
Figure 2B:
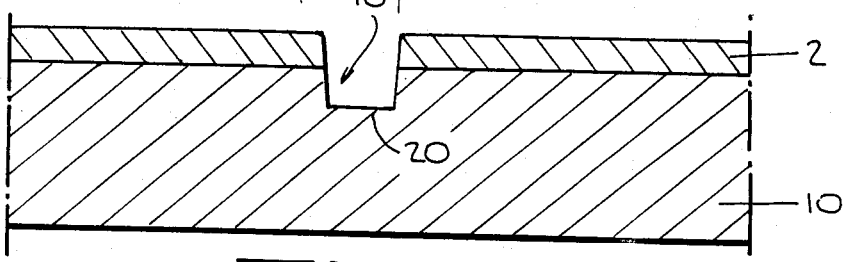

On a substrate 10, made of a p-type monocrystalline semiconductor material such as silicon and having a resistivity of about 25 ohm-cm at <100> orientation, a dielectric etching mask is formed. The etching mask of silicon oxide, depicted in FIGS. 2A and 2B, is thermally grown on the surface of the substrate in an atmosphere of steam at 1100° C. for 90 minutes, resulting in a thickness of about 8,000 angstroms. Next, a photoresist layer 4 is coated over the top of the oxide layer 2, exposed to a light pattern and developed to form an etching mask by conventional photolithographic techniques. The photoresist mask thus formed has a mask opening 18 through the photoresist layer 4 to the upper surface of the oxide layer 2. A portion of the silicon dioxide layer 2 is removed beneath the opening 18 by etching through the oxide layer in a conventional manner, such as by reactive ion etching. The etched silicon dioxide layer 2 with opening 18 therethrough serves as an oxide mask for etching the substrate 10.

FIG. 2B shows the next steps of the process. The photoresist layer 4 is completely removed and the substrate is etched through mask opening 7 to form a trench 20 in alignment with the mask opening. The trench is about 2 microns wide and 0.8 micron deep. Reactive ion etching using a plasma gas of either $Ar + NH_3$ or $CCl_4 + Cl_2$ gas is used in order to anisotropically etch the substrate 10. Reactive ion etching is described in U.S. Pat. No. 4,356,211 of Riseman. The silicon dioxide layer 2, contaminated with impurities, is removed by etching after the trench 20 is formed.

Figure 2C:
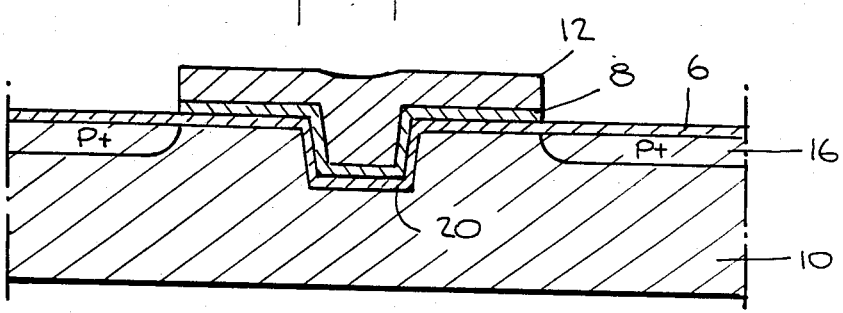
Figure 2D:
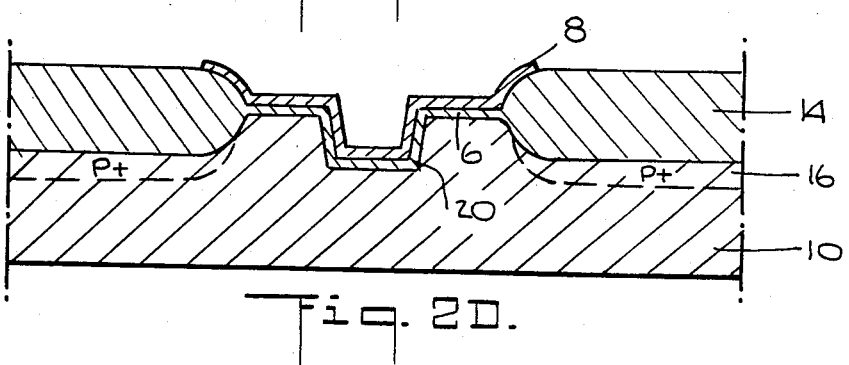

As shown in FIG. 2C, dielectric isolation regions are formed to separate the transistors from one another. Initially a layer 6 of silicon dioxide about 500 angstroms thick is thermally grown on the surface of the substrate 10, including the vertical and bottom surfaces of the trench 20. The oxide layer 6 is produced by heating the semiconductor device in oxygen at a temperature of 1000° C. for 50 minutes. Thereafter, a layer 8 of silicon nitride about 1500 angstroms is deposited using low pressure chemical vapor deposition (LPCVD) on the top surface of the silicon dioxide layer 6. Next, a photoresist layer 12 is deposited and photolithographical processed to produce an etch mask over the silicon nitride layer 8 and to provide an etching mask over the trench 20. The silicon nitride layer 8 is then etched by reactive ion etching in a conventional manner with $CH_4 + O_2$ gas using a D.C. voltage field and an A.C. voltage radio frequency field to produce a plasma of etching gas ions. This process removes the portion of the silicon nitride layer in alignment with the etching mask. A field region 16 of p-type material is implanted by ion bombardment of boron impurity atoms through the opened area into the substrate 10. The structure at this stage is shown in FIG. 2C. Thereafter, the photoresist layer 12 is removed and, as shown in FIG. 2D, the portions of the silicon dioxide layer 6 above the field region 16 are increased in thickness to about 8000 angstroms by thermal growth to form the oxide regions 14. The thermal growth is effected by heating in steam at 1000° C. for approximately 5 hours. These regions provide the dielectric isolation. Undesirable "bird's beak" shaped ends of tapered thickness are formed on oxide regions 14 due to lateral diffusion of the oxygen atoms from the oxide layers 6.

Figure 2E:
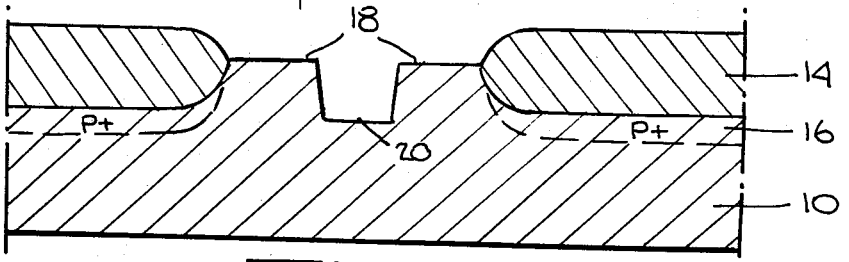

As shown in FIG. 2E, the silicon nitride layer 8 is removed by etching in hot phosphoric acid at approximately 180° C. and the silicon dioxide layers 6 removed by wet chemical etching using an aqueous solution of buffered hydrogen fluoride, $HF$ (aq.) $+ NH_4^+$ (aq.) $+ F^-$ (aq.), in order to eliminate the contaminated silicon dioxide.

Figure 2F:
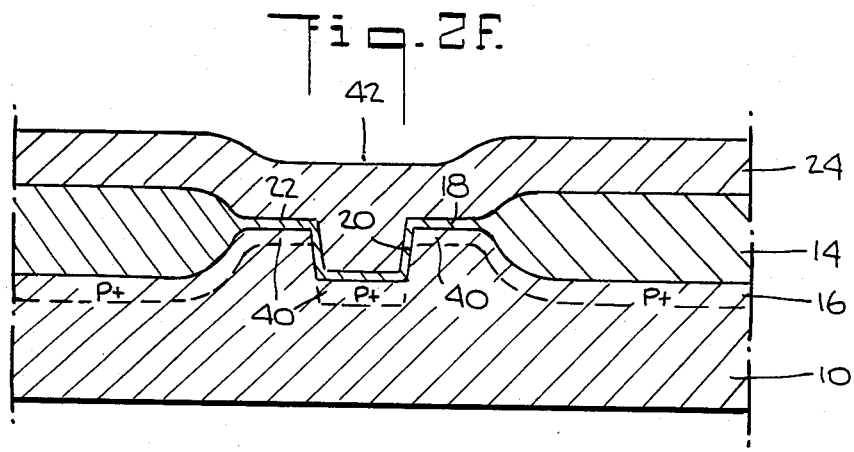

FIG. 2F shows a gate oxidation layer 22 of silicon dioxide (about 300 angstroms) formed by thermal growth oxidation over the trench region 20 and the region 18 of the substrate 10. This gate oxidation layer 22 is formed by heating the silicon in oxygen at a temperature of 920° C. Next, a p-channel region 40 is formed by ion bombardment implanting of boron or other p type impurities into the upper surface of the substrate 12 throughout the wafer. The p-channel region 40 merges with the field region 16 also of p-type material. Then, a layer of polycrystalline silicon 24, about 1.2 microns, is deposited by chemical vapor deposition on the upper surface of the oxide layer 22. The deposited polycrystalline silicon layer 24 refills the trench region 20 and planarizes the upper surface in region 42.

Figure 2G:
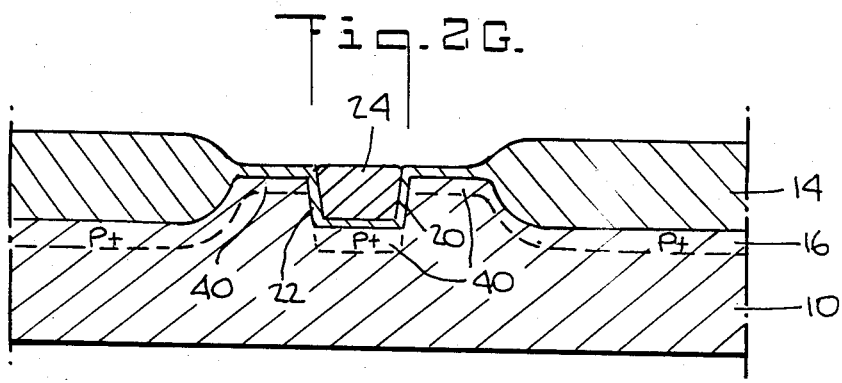
Figure 2H:
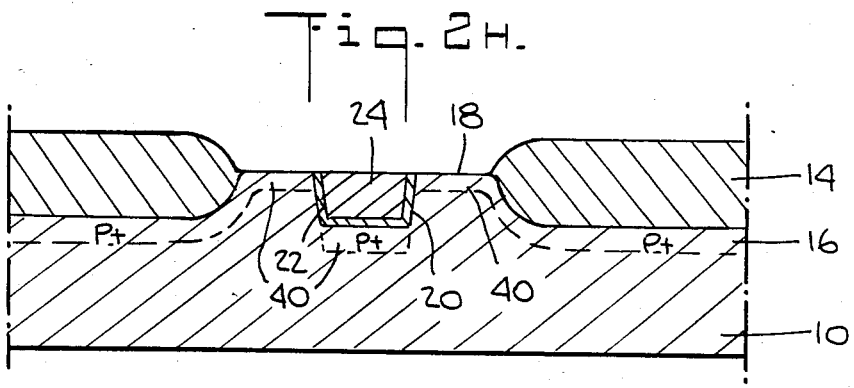

As shown in FIG. 2G, the polycrystalline silicon layer 24 is removed from the upper surface of the substrate 10 by reactive ion etching down to the surface of the thin silicon dioxide layer 22. Next, as shown in FIG. 2H, the portion of the thin silicon dioxide layer 22 atop of the region 18 is removed chemically using an aqueous solution of buffered hydrogen fluoride.

Figure 2J:
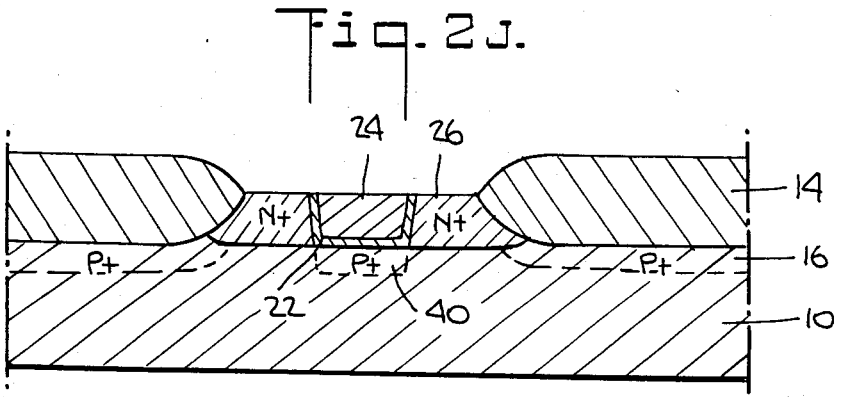

Thereafter, as shown in FIG. 2J, the wafer is doped by heating in a "thermal drive" step using phosphorus or other n-type impurity to provide a n+ polycrystalline silicon gate element 24 and the n+ silicon regions 26, the latter serving as the source and drain regions. The n+ silicon regions 26 have n+ characteristics because the dopant concentration of p-type impurity previously implanted into this region was controlled so that its concentration would be much lower compared to the amount of n-type dopant added.

Figure 2K:
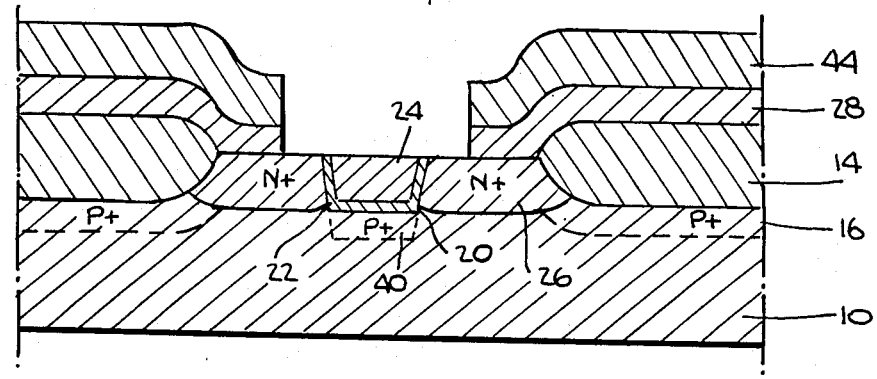

A layer of polycrystalline silicon 28, about 4500 angstroms, is deposited on the wafer surface and is doped with phosphorus impurity or other n-type dopants to provide n+ conductivity. A photoresist layer 44 is deposited over the polycrystalline silicon layer 28 and a mask is formed from such photoresist layer by conventional photolithographic techniques. The polycrystalline silicon layer is etched away in those areas not covered by the photoresist mask, leaving the so-called "buried contact" interconnection lines of n+ polycrystalline silicon 28. The resulting structure is shown in FIG. 2K.

Figure 2L:
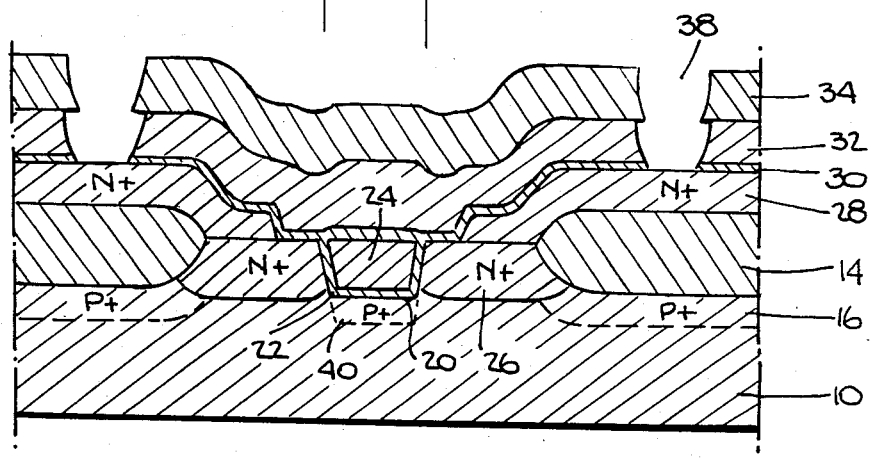

Next, after the mask is removed, a layer of silicon dioxide 30 (about 1000 angstroms) is formed on the top surface by thermal growth in oxygen at the temperature of 920° C. and a layer of silica glass 32 (about 8000 angstroms doped with the phosphorus impurity of about 3%) is deposited using chemical vapor deposition (CVD). Other good dielectric insulators can be deposited at lower temperatures (<700° C.) to form layer 32. A photoresist layer 34 is coated over the silica glass layer 32 and a mask is formed from such photoresist layer by conventional photolithographic techniques. Then, the openings 38 are formed by either a conventional wet-chemical-etching using buffered hydrogen fluoride solution or reactive ion etching. The resulting structure is shown in FIG. 2L.

Figure 2M:
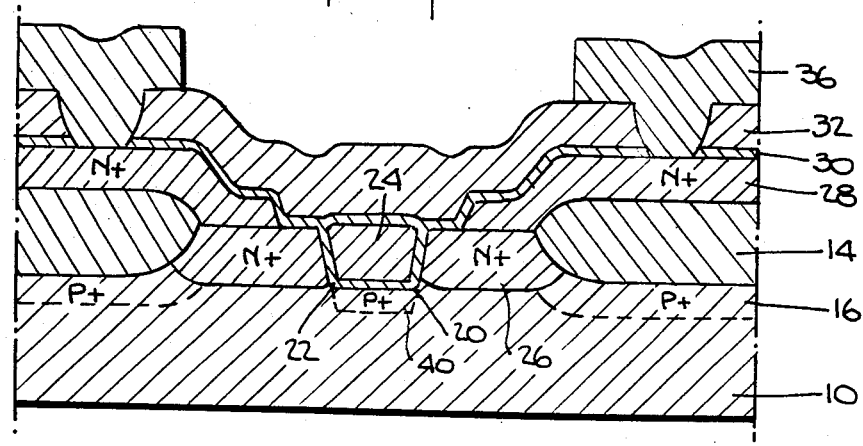

To complete the transistor, the photoresist layer 34 is removed and a metal contact 36, shown in FIG. 2M, is deposited by sputtering through the contact openings 38 into electrical contact with the conductive polycrystalline silicon layers 28. The contacts 36 may be made of a pure aluminum, or an alloy of 98.5% aluminum and 1.5% silicon. Photoresist etching of the metal layer 36 provides three contacts which are spaced apart for electrical insulation; two of them are connected through the conductive polycrystalline silicon 28 to the source and drain regions 26 and one of them (not shown) is connected through a conductive polycrystalline silicon (not shown) to the gate element 24.

A completed trench channel MOS transistor is shown in FIG. 2M, including the refilled polycrystalline silicon gate element and the buried contacts of n+ polycrystalline silicon to n+ source and drain regions. The trench channel MOS transistor of FIG. 2M also includes a trench channel region formed in the trench 20 having a silicon dioxide layer 22 on the inner surface of such trench and a filling 24 of n+ polycrystalline silicon deposited over such oxide layer. The source and drain elements 26 and gate element 24 of the trench transistor are connected to n+ polycrystalline silicon lines 28. The dielectric isolation 14 with the field implanted regions 16 are used to separate such trench transistor from other devices on the wafer.

It will be obvious to those having ordinary skill in the art that many changes may be made in the above-described preferred embodiments of the present invention. Therefore, the scope of the present invention should be determined by the following claims.

What is claimed is:

1. A process for manufacturing an MOS transistor, comprising:
   (a) forming a trench region in a monocrystalline semiconductor substrate of p- (or n-) type conductivity;
   (b) forming a gate insulation layer of semiconductor oxide on the vertical and bottom surfaces of said trench region;
   (c) depositing a gate element of semiconductor material on the gate insulation layer in said trench region so that said gate element substantially fills said trench region; and
   (d) forming source and drain elements on said substrate contiguous to the vertical surfaces of the gate insulation layer by doping said substrate, while simultaneously therewith doping said gate element, with an n- (or p-) type impurity; thereby forming an MOS transistor having source and drain elements in the same plane as the gate element.

2. The process of claim 1 wherein interconnection layers of low resistivity are deposited on the source and drain elements and on the doped gate element; wherein an insulating layer is deposited on the surface of said substrate; and wherein metal contacts are deposited over said interconnection layers so as to provide means of electrically connecting said source and drain elements and gate elements with electrical contact exterior to said transistor.

3. The process of claim 1 wherein the semiconductor substrate is silicon.

4. The process of claim 1 wherein the n-type dopant is phosphorus, arsenic, or antimony.

5. The process of claim 1 wherein the p-type dopant is boron, aluminum, gallium, or indium.

6. The process of claim 1 wherein the gate element of semiconductor material is a conducting film made from doped polycrystalline silicon, or a refractory metal silicide, or a refractory metal polycide.

7. The process of claim 2 wherein the interconnection layers of low resistivity material are made from doped polycrystalline silicon, or refractory metal silicide, or refractory metal polycide.

8. The process of claim 2 wherein the insulation layer is formed by the thermal growth method, chemical vapor deposition, or chemical vapor deposition after thermal growth.

9. The process of claim 2 wherein the metal contacts are formed by deposition through apertures in said insulating layer.

10. The process of claim 6 or 7 in which the said refractory metal is selected from the group consisting of tungsten, titanium, platinum, and molybdenum.

11. A process for manufacturing an MOS transistor, comprising:
    (a) forming a trench region in a monocrystalline semiconductor substrate of p- (or n-) type conductivity;
    (b) forming a gate insulation layer of semiconductor oxide on the surface of said monocrystalline semiconductor substrate, including on the vertical and bottom surfaces of said trench regions;
    (c) depositing a semiconductor material on said gate insulation layer so as to cover the surface thereof and to substantially fill said trench;
    (d) planarizing said structure so as to expose the surface of the monocrystalline semiconductor substrate surrounding said trench region and the vertical surfaces of the gate insulation layer; and
    (e) doping said substrate with an n- (or p-) type impurity so as to simultaneously form source and drain elements on said substrate contiguous to the vertical surfaces of the gate insulation layer and said gate element; thereby forming an MOS transistor having source and drain elements in the same plane as the gate element.

* * * * *